United States Patent [19]

Popovic et al.

[11] Patent Number: 4,607,271

[45] Date of Patent: Aug. 19, 1986

[54] MAGNETIC FIELD SENSOR

[75] Inventors: Radivoje Popovic, Steinhausen; Jean-Luc Berchier, Menzingen; Gernot Schneider, Baar; Heinz Lienhard, Zug, all of Switzerland; Heinrich P. Baltes, Edmonton, Canada; Katalin Solt; Tomislav Zajc, both of Zug, Switzerland

[73] Assignee: IGZ Landis & Gyr Zug AG, Zug, Switzerland

[21] Appl. No.: 551,717

[22] Filed: Nov. 14, 1983

[30] Foreign Application Priority Data

Nov. 22, 1982 [CH] Switzerland .................. 6790/82

[51] Int. Cl.[4] .......................................... H01L 27/22
[52] U.S. Cl. ................................... 357/27; 357/34; 357/43; 357/61; 307/309; 324/252
[58] Field of Search ............... 357/27, 34, 43, 61; 307/309; 324/252

[56] References Cited

U.S. PATENT DOCUMENTS

| | | | |
|---|---|---|---|
| 3,389,230 | 6/1968 | Hudson, Jr. ............... | 307/309 |
| 3,489,963 | 1/1970 | Gillett ....................... | 357/27 |
| 3,882,409 | 5/1975 | Yagi .......................... | 357/27 |
| 4,476,454 | 10/1984 | Aboaf et al. ............. | 324/252 |
| 4,477,853 | 10/1984 | Lemke ..................... | 357/27 X |
| 4,499,515 | 2/1985 | Piotrowski et al. ...... | 357/27 X |
| 4,506,220 | 3/1985 | Sawada et al. ........... | 324/252 |

OTHER PUBLICATIONS

Middelhoek et al; "Silicon Micro-Transducers: A New Generation of Measuring Elements," *Modern Electronic Measuring Systems*, ed. Regtien, 1978, pp. 19-21.
Takamiya et al, "Differential Amplification Magnetic Sensor," *IEEE Trans. on Elect. Devices*, vol. ED-19, No. 10, Oct. 1972, pp. 1085-1090.
Middelhoek, "Thin Films".
Mitnikova et al, "Investigations of the Characteristics of Silicon Lateral Magnetotransistors with Two Measuring Collectors,"*Sov. Phys. Semicond.*, 12(1), Jan. 1978, pp. 26-28.
Baltes et al, "Magnetic Field Micro-Sensor Based on Magneto-Resistive Comparators", *Proc. Sensor '82*, ed. Durst et al, Jan. 82, pp. 176-186.

*Primary Examiner*—Andrew J. James
*Assistant Examiner*—William Mintel
*Attorney, Agent, or Firm*—Marmorek, Guttman & Rubenstein

[57] ABSTRACT

The magnetic field sensor is composed of a semiconductor magnetic field sensor, for example a magnetotransistor, and at least one NiFe or NiCo film disposed upon its surface. This film functions as a zero-crossing switch utilizing its magnetic induction/magnetic field-reversal hysteresis properties. The film is deposited immediately above the field sensitive zone of the magnetic field sensor with its easy axis oriented perpendicularly to the direction of current flow of the sensor. The semiconductor magnetic field sensor detects the magnetic induction generated by the film.

10 Claims, 8 Drawing Figures

MAGNETIC FIELD SENSOR

BACKGROUND OF THE INVENTION

The present invention relates to a magnetic field sensor, in particular to a magnetic field sensor operating as a zero-crossing switch. Such sensors can be employed as parts of input current converters in electric meters. In such a case a magnetic field generated by the current to be measured is compared to a magnetic reference field, for example a sawtooth reference field, and the zero-crossings of the resultant field are detected by the magnetic field sensor to produce a mark-space modulation. Such sensors can be utilized as position sensors and in connection with micro-switches and for reading magnetic data storage devices.

The deposition of NiFe or NiCo films on semiconductor magnetic field sensors (Magnetic Energy Silicon Micro Transducers) for the purpose of reducing their temperature sensitivity by utilizing the magnetoresistive effect of this type of film is known from the publication:

"Magnetic Energy SMT's", chapter 1, pp. 19-21 and FIG. 14i, S. Middlehoek et al; *Modern Electronic Measuring Systems,* ed. by P. P. L. Rietgen, Delft University Press, 1978.

Semiconductor magnetic field sensors of the prior art include: magnetoresistors, Hall elements, magnetodiodes, magnistors (also called magnetotransistors), magFET's and Hall-MOSFET's.

The utilization of the magnetoresistive effect of NiFe or NiCo films to perform zero-crossing from the publication:

"Magnetic Field Micro-Sensor based on Magneto-Resistive Comparators", pp. 176-186, H. P. Baltes et al; *Proc. Sensor* 1982, ed. by F. Durst et al, Essen, Federal Republic of Germany, 1982.

In comparison to the magnetic induction/magnetic field-reversal hysteresis of NiFe or NiCo films, the magnetoresistive effect of said films is a secondary and therefore less significant effect, displaying a resistivity change of only 1%-2% on switching. Useful signals are obtained with very thin 200 Å films of not too small size with an innate magnetic axis at an angle to the orientation of the imposed magnetic field $H_a$. The technological problems of such films - fabrication, reliability, etc. are considerable. Furthermore, films employed for this purpose require electrical circuitry with the associated connections. Such films are also loaded by electrical current, and any increase in self-generated noise will impede miniaturisation of the film areas.

By avoiding the use of magnetoresistive zero-crossing detectors, there will result technological simplifications which have a favorable effect on the durability of the films and on power consumption; the films are not loaded with high current densities, they do not require any electrical contacts, they may be made thicker, they produce stronger output signals and the signal shapes are also better defined than when using the magnetoresistive effect.

The inductive operation and inductive detection of NiFe and NiCo films is known from the publication:

"Thin Films", chapter 8, pp. 269-339, S. Middlehoek; *Magnetic Properties of Materials,* ed. by J. Smit, McGraw-Hill, 1971.

In this case, the favorable properties of these films in magnetic induction/magnetic field-reversal hysteresis is utilized. They do, however, require complex hardware and the magnetic field sensor is susceptible to the reception of spurious noise. The requirements of the higher sensitivity and the miniaturisation are conflicting requirements. The output signal of the sensor is only approximately 1 mV.

By avoiding the use of inductive detection of the film signal, the arrangement is simplified and the use of induction coils or induction leads is obviated in contrast to the prior art. The generation of spurious noise typical of induction coils is also eliminated.

Pure semiconductor magnetic field sensors, such as magnetotransistors, have the following disadvantages:
 a high offset voltage;
 slowly rising signals, especially in MOS-technology, and limited opportunity for improvement due to problems of instability; sophisticated circuitry, such as the use of feedback, can result in the reduction of rise-times, but cannot attain the high quality of the magnetic induction/magnetic field-reversal characteristics of a NiFe or a NiCo film.

The design and operation of a magnetotransistor are know from the reference:

"Investigation of the Characteristics of Silicon Lateral Magnetotransistors with Two Measuring Collectors", pp. 26-28, I. M. Mitnikova et al; *Sov. Phys. Semicond.* 12(1), January 1978.

SUMMARY OF THE INVENTION

It is therefore a principal object of the present invention to provide a magnetic field sensor for detecting the zero-crossing of magnetic field reversals which avoids the disadvantages of the known magnetic field sensors mentioned above. It fulfills the following conditions:
 the excellent magnetic induction/magnetic field-reversal hysteresis characteristics of NiFe or NiCo are utilized;
 a strong output signal of the order of 10 mV;
 the influence of external and internal noise is minimized;
 as much as possible of the magnetic field sensor in standard silicon IC technology is realized, and
 the complications involved in the technology of extremely thin, current-carrying NiFe or NiCo films are avoided.

This object is achieved in a magnetic field sensor that comprises a semiconductor magnetic field sensor which has at least one NiFe or NiCo film disposed upon its surface. The film functions as a zero-crossing switch by utilizing its magnetic induction/magnetic field reversal characteristics. The film is deposited immediately above a field sensitive zone of the magnetic field sensor with its easy axis being oriented perpendicularly to the direction of current flow of the sensor. The semiconductor magnetic field sensor detects the magnetic induction generated by the film.

Further objects and advantages of the invention will be set forth in part in the following specification, and in part will be obvious therefrom, without being specifically referred to, the same being realized and attained as pointed out in the claims.

DESCRIPTION OF THE DRAWINGS

For a fuller understanding of the nature and objects of the invention, reference should be had to the following detailed description, taken in connection with the accompanying drawings, in which.

The same reference numbers designate the same components in all figures of the invention.

DESCRIPTION OF THE PREFERRED EMBODIMENTS

The magnetic field sensor includes a NiFe or NiCo film and a semiconductor magnetic field sensor, both integrated in a common semiconductor substrate. This film serves as a zero-crossing switch utilizing its magnetic induction/magnetic field-reversal hysteresis curve, while no use is made of its magnetoresistive effect. The semiconductor magnetic field sensor detects the film's switching action by means of the magnetic induction generated by the film in its immediate proximity. Every semiconductor magnetic field sensor has a field sensitive zone. In a magneto-transistor, for example, this is the zone between the emitter region and the nearest collector region.

Figure 1:
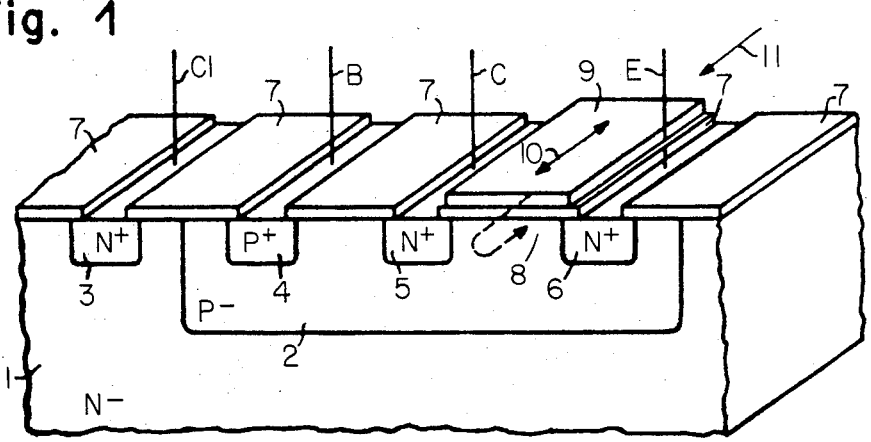
FIG. 1 is a perspective view of a magnetic field sensor in accordance with an embodiment of the invention.

In FIG. 1, a preferred embodiment of the invention is shown employing a magnetotransistor. As an example, a bipolar NPN transistor will be described. The magnetic field sensor can also be made with a PNP magnetotransistor instead of NPN if the corresponding reversals of material conductivity types well known in transistor technology are taken into account. The magnetic field sensor may be made in CMOS technology.

According to FIG. 1, the magnetotransistor includes an ordinary monocrystalline silicon substrate 1 comprising N-material weakly doped with impurity atoms, namely N$^-$-material, the resistivity of which is approximately one Ohm/cm. Employing process steps known from IC technology, the following regions are formed in the surface of the silicon substrate 1 by ion implantation or by diffusion of impurity atoms into the silicon substrate 1, or both:

a P$^-$-well of P-material lightly doped with impurity atoms, that is of the opposite material conductivity type to that of silicon substrate 1, to form a base region 2, and an N$^+$-region of N-material heavily doped with impurity atoms disposed to the left of said P$^-$-well as shown in FIG. 1 to form a secondary collector contact 3.

In the same manner, the following regions are formed in the surface of the P$^-$-well reading from left to right in the drawing:

a P$^+$ subregion heavily doped with impurity atoms to form a base contact 4.

a first N$^+$-subregion heavily doped with impurity atoms to form a collector region 5, and a second N$^+$-subregion heavily doped with impurity atoms to form an emitter region 6.

The collector region 5 is therefore located between the emitter region 6 and the base contact 4.

The secondary collector contact 3, base contact 4, collector region 5 and emitter region 6 all have, in the standard embodiment of the magnetotransistor, the same depth, namely 1 mm, the same density of doping with impurity atoms and a resistivity less than or equal to 50 Ohms per square. The optional base region 2, for instance, has a resistivity of 1 kOhm per square and a depth of approximately 10 μm. The P/N junction between the silicon substrate 1 and the base region 2 is reverse-biased by means of the secondary collector contact 3 and the base contact 4.

In an improved embodiment of the magnetotransistor, the emitter region 6 is more shallow than the other regions, such as contacts, but thicker than 0.5 μm and-/or is so lightly doped with impurity atoms that its resistivity is greater than 100 Ohms per square. In the latter case of being lightly doped, the emitter region 6 must have a subregion heavily doped with impurity atoms and of the same conductivity type as emitter region 6 diffused into its surface as an ohmic emitter contact.

The remaining design details of the magnetotransistor are known per se. In particular, its entire surface is coated with a thin protective layer, namely of silicon dioxide, the so-called passivation layer 7. The regions such as contacts 3, 4, 5 and 6 each have a metallic lead shown in FIG. 1 from left to right as secondary collector lead C1, base lead B, collector lead C and emitter lead E.

Immediately above the field sensitive zone 8 of the magnetotransistor, namely immediately above the zone between the emitter region 6 and the collector region 5, a thin, anisotropic, magnetically aligning and field reversals switching NiFe or NiCo film 9 is galvanically deposited upon the passivation layer 7 by evaporation or by cathode sputtering in such a manner that its easy axis EA 10 is oriented perpendicularly to the cross section of the magnetotransistor delineated in FIG. 1, namely perpendicularly to the direction of the current flux in the semiconductor magnetic field sensor.

A magnetic field 11 to be detected by the sensor and having a value Ha is parallel to the easy axis 10. While inductive methods employing films detect temporal flux variations dΦ/dt, the present magnetic field sensor utilizes the local magnetic induction $B_f$ in the field sensitive zone 8 directly and detects it as a semiconductor magnetic field sensor. This requires that the film be located in as close proximity as possible to the zone 8, in order that the greatest possible portion of its magnetic flux pass through the zone 8. The film functions as a miniature magnet, the direction of magnetization of which is instantaneously reversed by the field reversal zero-crossing of the imposed field to be detected. As a consequence, the orientation of the magnetic field generated by the miniature magnet in its immediate proximity also changes. The field strength amounts to several Gauss. The abrupt change of field orientation is detected by the semiconductor magnetic field sensor lying thereunder which in turn produces a corresponding digital electric signal.

As the film is not employed as a magnetoresistor, it requires no electrical connections and consequently no electrical contacts to the semiconductor magnetic field sensor, namely to the magnetotransistor. The passivation layer 7 electrically isolates the magnetotransistor from the film.

Figure 2:
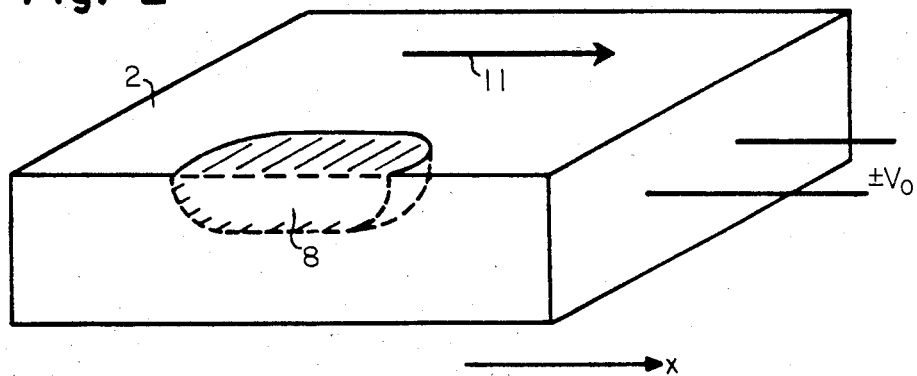
FIG. 2 is a perspective view of the field sensitive zone of a magnetotransistor without film.
Figure 3:
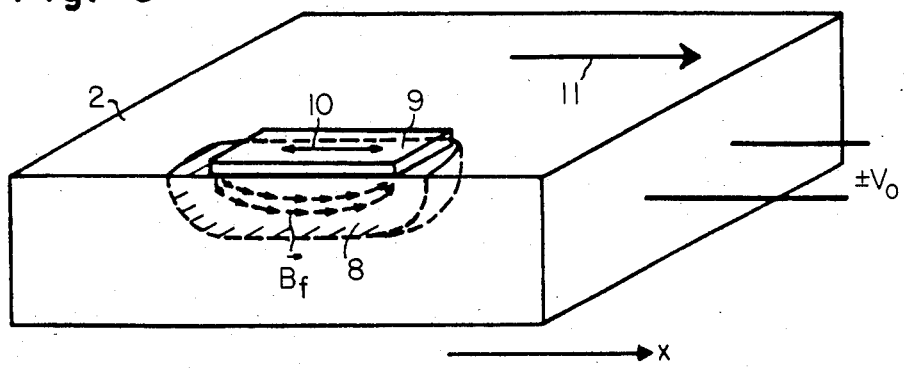
FIG. 3 is a perspective view of the field sensitive zone of a magnetotransistor with film.

FIGS. 2 and 3 schematically show the basic arrangement of the field sensitive zone 8 of the semiconductor magnetic field sensor. The easy axis 10 of the film 9 and the magnetic field 11 to be detected are oriented parallel to the x-axis. The field lines of the magnetic induction $B_f$ generated by the film 9 run approximately as indicated in FIG. 3. The magnetic induction $B_f$ is detected in the field sensitive zone 8 of the magnetic field sensor, and in particular, so is the sign reversal of vector $B_f$, as generated by the sign reversal of saturation magnetization of the film 9.

Figure 4:
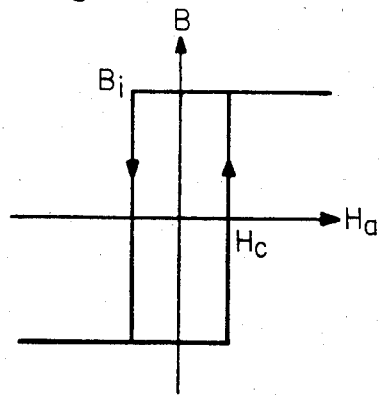
FIG. 4 is graph that illustrates a charecteristic curve of a rectangular magnetic induction/magnetic field-reversal hysteresis of a NiFe or NiCo film.

The hysteresis loop of the film 9 when driven in the direction of the easy axis is nearly rectangular (FIG. 4).

This rectangular hysteresis loop is the most significant property of NiFe and NiCo films and is much more readily controllable than the magnetoresistive properties. In FIG. 4 the internal magnetic induction in the film is $B_i \approx 1$ Tesla and $H_c \approx 10^{-4}$ Tesla.

As for $H_a \neq H_c$ the film is always in saturation, the resultant flux density in the proximity of the film can be represented as a linear superposition of the magnetic induction $\mu H_a$ generated by the magnetic field 11 to be detected and of the magnetic induction $B_f$ generated by the film 9.

$$B = \mu H a \pm B_f \quad (1)$$

where $\mu\delta\mu$ is the magnetic permeability of the material which surrounds the film 9 and $B_f$ is the magnetic induction when $H_a = 0$.

From FIG. 3 and Equation (1), the magnetic induction B in the proximity of the film can be determined. For instance, below the film 9 in the middle of the field sensitive zone 8, the following approximately applies:

$$\vec{H}_a \| \vec{B}_f \| \vec{B} \| \vec{EA} \| x. \quad (2)$$

Figure 5:
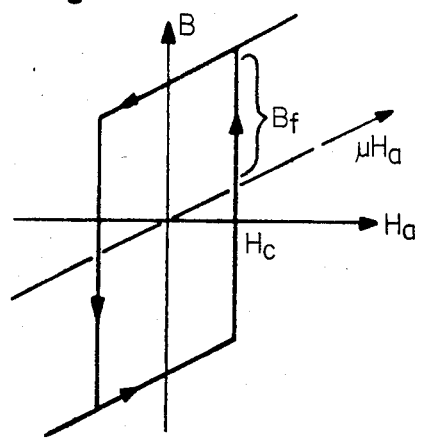
FIG. 5 is a graph that illustrates a characteristic curve of a magnetic induction/magnetic field-reversal hysteresis in the center of the field sensitive zone in the presence of a film.

The shape of $\vec{B}$ as a function of $\vec{H}_a$ shown in FIG. 5 is a result of this relation in the aforementioned Equation (2).

It can be calculated that, for example, for a NiFe film of 50 µm length and 500 Å thickness, the magnetic induction generated at a distance of a few µm amounts to about $$B_f \delta 1 \times 10^{-3} \text{ Tesla} \quad (3)$$

In the case of a typical semiconductor magnetic field sensor having a sensitivity of 10 V/Tesla, an output signal is produced with the steps of:

$$\Delta V \delta \pm -2. \ B_f. \ 10 \text{ V/Tesla } \delta \pm 20 \text{ mV} \quad (4)$$

as soon as $H_a$ becomes equal to $\pm H_c$. The total output signal of the magnetic field sensor is then:

$$V_o = V + \Delta V \quad (5)$$

wherein V designates that portion of the output signal generated by the magnetic induction B that arises from the direct detection of $H_a$.

Figure 6:
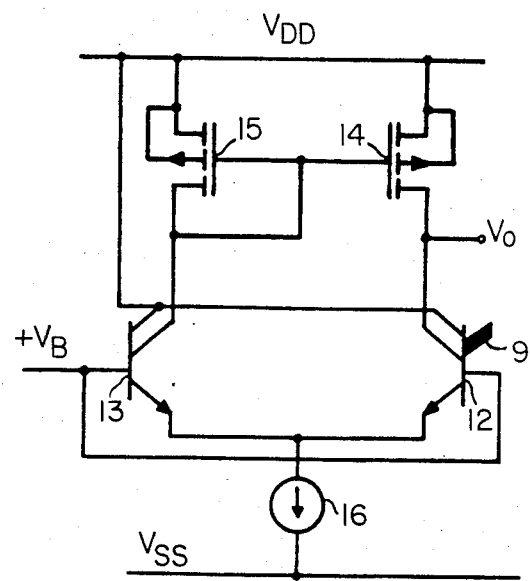
FIG. 6 is a circuit diagram of a differential amplifier employing two magnetic field sensors of the type of FIG. 1.

As only $\Delta V$ is of interest, V must be eliminated, for instance by means of a differential amplifier according to FIG. 6. The differential amplifier includes a first magnetotransistor 12 with the film 9 and a second magnetotransistor 13 without a film, both of which have a load resistor in the form of MOS biasing transistors 14 and 15. The secondary collector contacts of both magnetotransistors 12 and 13 are connected in common to a positive supply rail $V_{DD}$ of a voltage supply. Both emitter regions of the magnetotransistors are connected in common by means of a current source 16 to a negative voltage supply rail $V_{SS}$ of the voltage supply. Both base contacts are directly connected to a positive potential $+V_B$ which is so chosen that the P/N junctions between silicon substrate 1 and base region 2 of both magnetotransistors are reverse biased. The collector region of the first magnetotransistor 12 is connected to the positive rail $V_{DD}$ of the voltage supply by means of source/drain path of the first MOS biasing transistor 14 and that of the second magnetotransistor 13 is connected to positive supply rail $V_{DD}$ by means of the source/drain path of the second MOS biasing transistor 15. Both gates of MOS biasing transistors 14 and 15 are connected to the collector region of the second magnetotransistor 13 and both substrates of the biasing transistors 14 and 15 are directly connected to the positive rail $V_{DD}$ of the voltage supply. Both magnetotransistors 12 and 13 are arranged in mutually parallel orientation and except for the film 9 are identical.

Both MOS bias transistors 14 and 15 operate as current mirrors, so that both magnetotransistors 12 and 13 are biased with equal and constant collector currents that are independent of the value of the applied external magnetic field. The collector region of the first magnetotransistor forms a unipolar output of the differential amplifier where in addition to a known constant voltage the voltage $\Delta V$ appears.

In addition to the arrangement having a rectangular film as shown in FIG. 3, other film shapes are possible and according to the type of semiconductor magnetic field sensor more or less advantageous. For example, two films may be arranged separated by a gap of a length W; furthermore ellipsoid films (against nucleation), or focusing arrangements may be used, to enhance the sensitivity of semiconductor magnetic field sensors having a particularly small sensitive zone.

Figure 7:
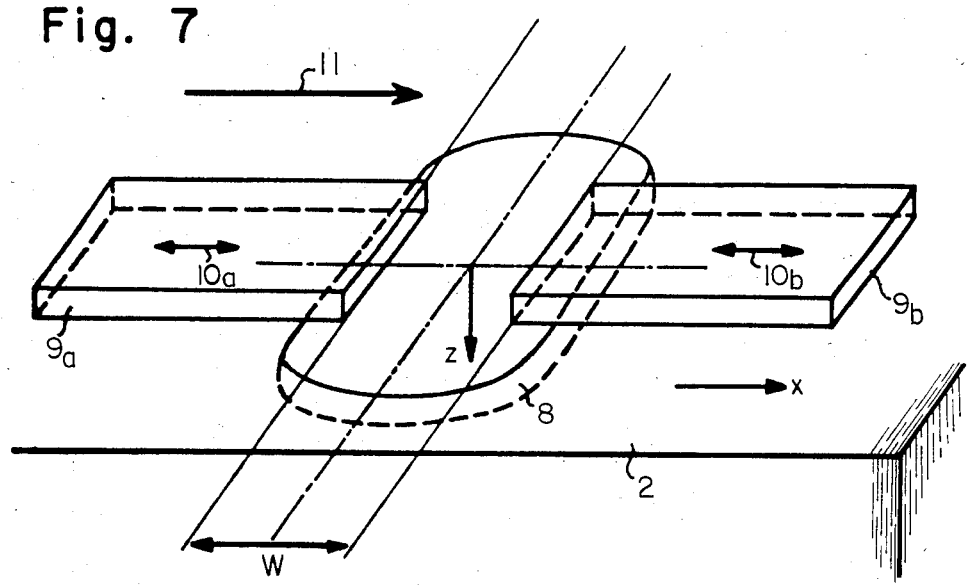
FIG. 7 is a perspective view of a modified magnetic field sensor.

FIG. 7 shows an example of an arrangement with two rectangular films 9a and 9b having parallel easy axes 10a and 10b of which an intermediate air gap lies over the sensitive zone 8, both films being so disposed that each lies in the extension of the other. The field distribution in the air gap between the two sufficiently long films is nearly the same as that of a single film having a length W equal to said air gap.

The middle of the air gap contains the magnetic induction $B_f$ in the range of 5 to 15 Gauss, depending on the length of the air gap W that ranges from 20 to 40 um and on the depth z that ranges from 0 to 10 um. This arrangement therefore has a sensitivity ($\Delta V = 10$ to 30 mV) similar to that of a single film. A technological advantage is that larger, in particular longer, films can be employed.

Figure 8:
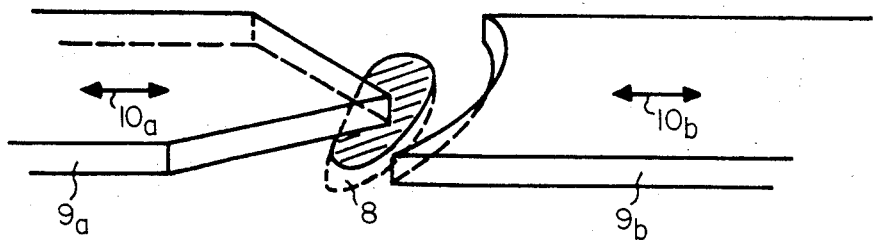
FIG. 8 is a perspective view of a further modified magnetic field sensor.

FIG. 8 shows a field-focusing film shape which is also formed by two separate films 9a and 9b. The arrangement is similar to that of FIG. 7 except that here both film ends adjacent the air gap are not parallel but the end of film 9a is pointed and the end of the other film 9b is concave. We wish it to be understood that we do not desire to be limited to the exact details of construction shown and described, for obvious modifications will occur to a person skilled in the art.

Having thus described the invention, what we claim as new and desire to be secured by Letters Patent is as follows:

1. A sensor for detecting field reversals in a magnetic field comprising:
   a magnetic field sensitive semiconductor device,
   a thin film comprising nife or nico which functions as a magnet formed on a surface of said magnetic field sensitive semiconductive device, said film having a direction of magnetization which is capable of reversal in response to said field reversals of said magnetic field, said film being free of any electrical contacts thereto so that substantially no electrical current flows in said film,
   said magnetic field sensitive semiconductor device being adapted to produce an electrical signal in response to reversals in the direction of magnetization of said film.

2. A sensor as claimed in claim 1, wherein said film comprises two film portions separated by an air gap, said film portions having easy axes which are aligned substantially parallel.

3. A sensor as claimed in claim 2 wherein both of said film portions have rectangular plan forms.

4. A sensor as claimed in claim 2, wherein mutually opposing ends of said film portions adjacent to the air gap are shaped to focus the magnetic field produced by said film portions.

5. A magnetic field sensor as claimed in claim 4 wherein one film portion has an end adjacent the air gap which is pointed and the other film portion has an end adjacent the air gap which is concave.

6. The sensor of claim 1 wherein said semiconductor device is a magnetotransistor comprising
   a relatively weakly doped semiconductor substrate of a first conductivity type,
   a relatively weakly doped base region of a second conductivity type formed in said substrate,
   a relatively highly doped emitter region of said first conductivity type formed at a surface of said base region,
   a relatively highly doped collector region of said first conductivity type formed at said surface of said base region, and
   a passivating layer formed on said surface of said base region between said emmitter and said collector,
   said film which functions as a magnet being formed on said passivating layer.

7. A magnetic field sensor as claimed in claim 6, wherein said emitter region is shallower than any of said other regions but has a depth greater than 0.5 μm.

8. A magnetic field sensor as claimed in claim 6, wherein said emitter region has a sheet resistivity greater than 100 ohms/□.

9. A sensor as claimed in claim 6 wherein said sensor further includes a second magnetotransistor, said second magnetotransistor being devoid of any film which functions as a magnet, said magnetotransistor having said film formed thereon being interconnected with said magnetotransistor devoid of said film to form a differential amplifier.

10. The sensor of claim 6 wherein a current flows between said emmitter and collector and wherein said film has an easy axis for magnetization oriented perpendicular to the direction of current flow.

* * * * *